United States Patent
Wang

(10) Patent No.: US 9,033,028 B2
(45) Date of Patent: May 19, 2015

(54) HEAT DISSIPATION MODULE

(71) Applicant: Quanta Computer, Inc., Taoyuan Shien (TW)

(72) Inventor: Che-Ming Wang, Taoyuan Shien (TW)

(73) Assignee: QUANTA COMPUTER INC., Taoyuan Shien (TW)

( * ) Notice: Subject to any disclaimer, the term of this patent is extended or adjusted under 35 U.S.C. 154(b) by 194 days.

(21) Appl. No.: 13/935,315

(22) Filed: Jul. 3, 2013

(65) Prior Publication Data
US 2014/0290908 A1 Oct. 2, 2014

(30) Foreign Application Priority Data

Apr. 2, 2013 (TW) .............................. 102111917 A

(51) Int. Cl.
| | |
|---|---|
| H05K 7/20 | (2006.01) |
| H01L 23/34 | (2006.01) |
| F28D 1/00 | (2006.01) |
| H01L 23/427 | (2006.01) |
| H01L 23/467 | (2006.01) |
| F28D 15/02 | (2006.01) |
| H01L 21/48 | (2006.01) |

(52) U.S. Cl.
CPC ........ *H01L 23/34* (2013.01); *H05K 7/20* (2013.01); *F28D 15/02* (2013.01); *F28D 1/00* (2013.01); *H01L 23/427* (2013.01); *H01L 23/467* (2013.01); *H01L 21/4882* (2013.01)

(58) Field of Classification Search
CPC ... H05K 7/20; H05K 7/2029; H05K 7/20145; H05K 7/00; H05K 5/00; F28F 7/00; F24H 3/02; F04B 35/04; H01L 23/467; F28D 15/00; F28D 15/02; F28D 15/04; G06F 1/20

USPC ......... 165/80.1, 80.3, 121, 122, 124, 104.33; 361/697, 700; 415/58.4, 58.6, 176, 415/177, 178

See application file for complete search history.

(56) References Cited

U.S. PATENT DOCUMENTS

| | | | |
|---|---|---|---|
| 6,732,786 B1 * | 5/2004 | Lee .............................. | 165/80.3 |
| 8,023,265 B2 * | 9/2011 | Yang et al. .................... | 361/700 |
| 8,405,997 B2 * | 3/2013 | Fujiwara ....................... | 361/711 |
| 8,439,632 B2 * | 5/2013 | Chou ............................ | 415/127 |
| 8,891,234 B2 * | 11/2014 | Huang et al. ............. | 361/679.47 |
| 8,932,010 B2 * | 1/2015 | Huang et al. .................. | 415/178 |
| 8,934,243 B2 * | 1/2015 | Ito et al. ........................ | 361/697 |

(Continued)

FOREIGN PATENT DOCUMENTS

CN 200965664 10/2007

*Primary Examiner* — Leonard R. Leo
*Assistant Examiner* — Gustavo Hincapie Serna
(74) *Attorney, Agent, or Firm* — Sawyer Law Group, P.C.

(57) ABSTRACT

A heat dissipation module includes a centrifugal fan and a heat pipe. The centrifugal fan includes an outer housing, a heat dissipation fin array, a retaining wall, an impeller and a rotation-driving device. The outer housing includes an axial air inlet, an axial air outlet and a radial air outlet. The heat dissipation fin array is located at an inner wall of the radial air outlet. The retaining wall is located on a flat wall of the outer housing on which the axial air outlet is located. The retaining wall is in contact with an inner wall of an electronic device to collectively form a circulation channel so as to guide airflows output from the axial air outlet through the flat wall with which the heat dissipation fin array is aligned, and into the axial air inlet. The heat pipe is in contact with the heat dissipation fin array.

10 Claims, 3 Drawing Sheets

(56) References Cited

U.S. PATENT DOCUMENTS

| | | | |
|---|---|---|---|
| 2008/0011460 A1* | 1/2008 | Hwang et al. | 165/122 |
| 2008/0135210 A1* | 6/2008 | Wang et al. | 165/80.3 |
| 2008/0174958 A1* | 7/2008 | Horng | 361/695 |
| 2012/0255713 A1* | 10/2012 | Horng et al. | 165/121 |

* cited by examiner

HEAT DISSIPATION MODULE

CROSS-REFERENCE TO RELATED APPLICATIONS

This application claims priority to Taiwan Application Serial Number 102111917, filed Apr. 2, 2013, which is herein incorporated by reference.

FIELD OF INVENTION

The present invention relates to a heat dissipation module. More particularly, the present invention relates to a heat dissipation module equipped with a centrifugal fan.

BACKGROUND

A heat dissipation module equipped with a centrifugal fan is used in most notebook computers as their system coolers. The heat dissipation module includes a centrifugal fan, a heat pipe and a heat dissipation fin array. A first end of the heat pipe is in contact with a heat source, e.g., a CPU, while a second opposite end of the heat pipe is connected with the heat dissipation fin array, thereby transferring heat from the heat source to the heat dissipation fin array. The heat dissipation fin array is fastened to an air outlet of the centrifugal fan. When an impeller of the centrifugal fan rotates, airflows carry the heat on the heat dissipation fin array out of the notebook computer.

However, the notebook computers are designed to be thin and compact, the dissipation modules inside them are also designed to be thinner. The heat dissipation fin array of the heat dissipation module cannot effectively take away the heat and its temperature is thus raised. The adjacent enclosure surface temperature is also elevated and causes a user discomfort.

SUMMARY

It is therefore an objective of the present invention to provide an improved heat dissipation module equipped with a centrifugal fan.

In accordance with the foregoing and other objectives of the present invention, a heat dissipation module includes a centrifugal fan and a heat pipe. The centrifugal fan includes an outer housing, a heat dissipation fin array, a retaining wall, an impeller and a rotation-driving device. The outer housing includes an axial air inlet, an axial air outlet and a radial air outlet. The axial air outlet is located at a corner of the outer housing where a tongue portion is located. The heat dissipation fin array is located at an inner wall of the radial air outlet. The retaining wall is located on a flat wall of the outer housing on which the axial air outlet is located. The retaining wall is in contact with an inner wall of an electronic device to collectively form a circulation channel so as to guide airflows output from the axial air outlet through the flat wall with which the heat dissipation fin array is aligned, and into the axial air inlet. The impeller is located within the outer housing. The rotation-driving device is located within the outer housing and used to rotate the impeller. The heat pipe is in contact with the heat dissipation fin array, wherein the retaining wall and the heat pipe are located at two opposite sides of the heat dissipation fin array.

According to another embodiment disclosed herein, the axial air outlet is aligned with a terminal end of the heat pipe.

According to another embodiment disclosed herein, the circulation channel is an L-shaped channel.

According to another embodiment disclosed herein, an opening of the L-shaped channel communicates with the axial air inlet.

According to another embodiment disclosed herein, part of the retaining wall is aligned with a boundary of the heat dissipation fin array.

According to another embodiment disclosed herein, the heat dissipation fin array is made from cooper, aluminum or alloys thereof.

According to another embodiment disclosed herein, the heat dissipation module further includes a slope located between the tongue potion and the radial air outlet to guide airflows to the axial air outlet.

According to another embodiment disclosed herein, the slope and the heat dissipation fin array are arranged side by side at the inner wall of the radial air outlet.

According to another embodiment disclosed herein, the retaining wall is made from sponge.

According to another embodiment disclosed herein, the radial air outlet has a length L, the axial air outlet has a length equal to 0.1 L, and the axial air outlet has a width equal to 0.06 L.

Thus, the heat dissipation module utilizes an axial air outlet of its centrifugal fan to cycle airflows through the circulation channel so as to form a thermal resistance barrier between a heat dissipation fin array and an adjacent the inner wall of the outer housing. In addition, the corner of the centrifugal fan where the axial air outlet is located is a relatively weak flow section of the radial air outlet, the borrowed airflow volume of the axial air outlet does not affect a thermal performance of the heat pipe too much.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
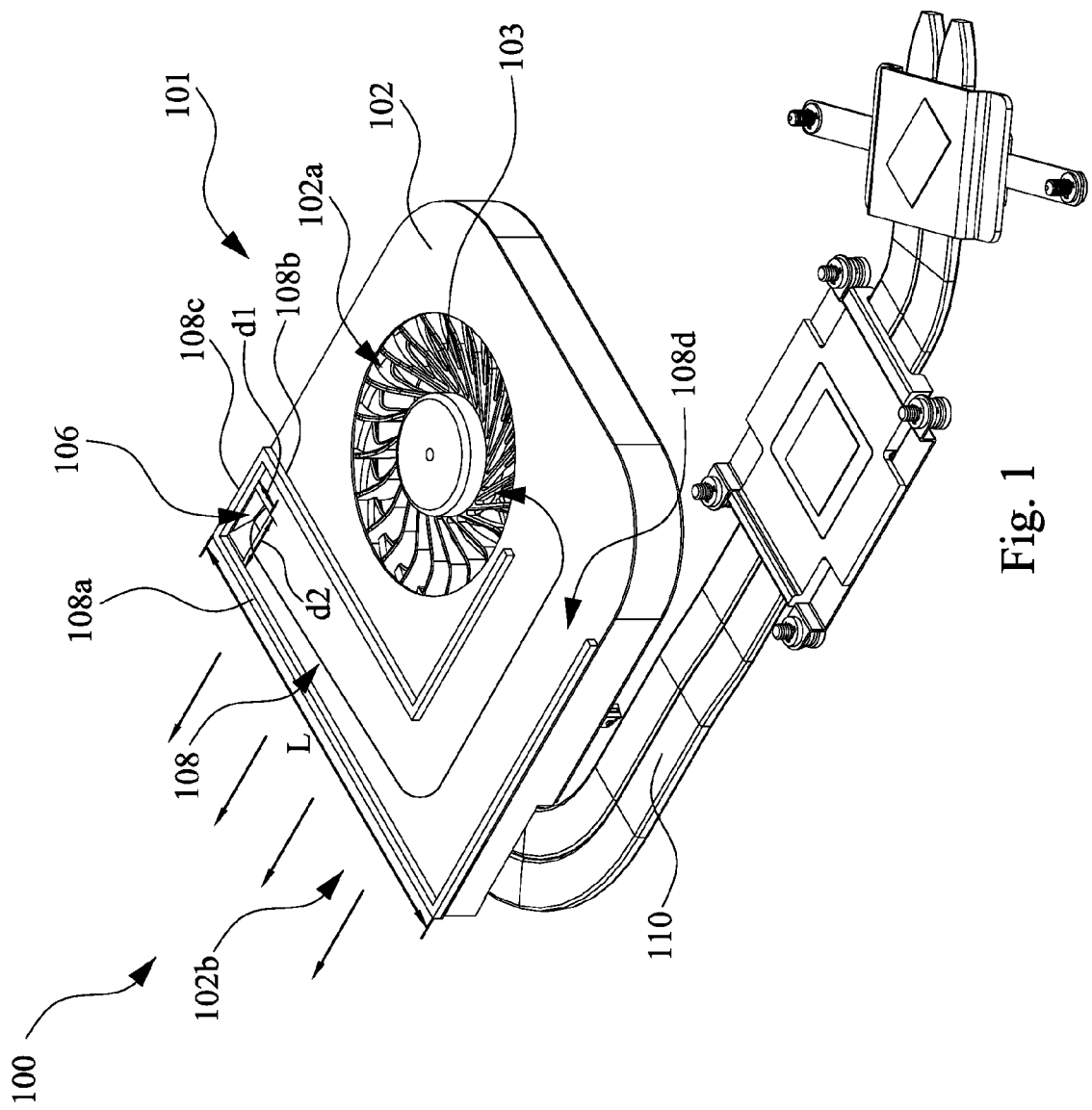
FIG. 1 illustrates a perspective view of a heat dissipation module equipped with a centrifugal fan according to an embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In order to solve the problem that a conventional heat dissipation fin array causes an adjacent wall to have a high temperature, the present invention proposes a new heat dissipation module, its centrifugal fan is equipped with an axial air outlet, and a airflow circulation channel for guiding airflows output from the axial air outlet such that the circulating airflows serve as a thermal resistance barrier between a heat dissipation fin array and its adjacent wall.

Figure 2:
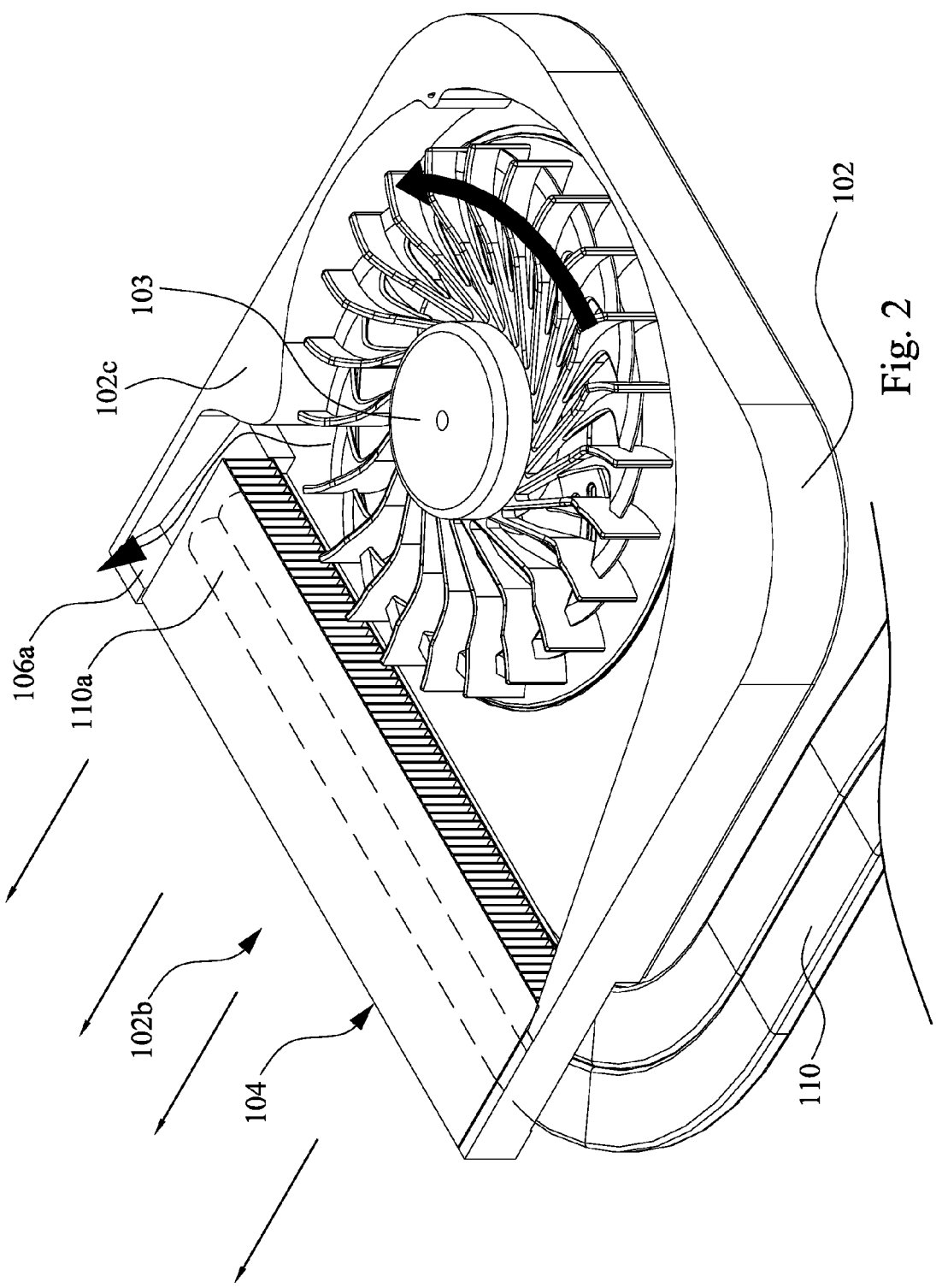
FIG. 2 illustrates an enlarged view of the heat dissipation module in FIG. 1 with a top wall removed.

Referring both to FIG. 1 and FIG. 2, FIG. 1 illustrates a perspective view of a heat dissipation module equipped with a centrifugal fan according to an embodiment of this invention, and FIG. 2 illustrates an enlarged view of the heat dissipation module in FIG. 1 with a top wall removed.

A heat dissipation module 100 includes a centrifugal fan 101 and a heat pipe 110. An outer housing 102 of the centrifugal fan 101 includes an axial air inlet 102a, an axial air outlet 106 and a radial air outlet 102b. The "axial" or "radial" is referred as an "axial" or "radial" direction of an impeller 103 of the centrifugal fan 101.

The axial air outlet 106 is located at a corner of the outer housing 102 where a tongue portion 102c is located (referring to FIG. 2). A heat dissipation fin array 104 is installed at an inner wall of the radial air outlet 102b of the outer housing 102. Retaining walls (108a, 108b, 108c) is formed on a flat wall of the outer housing 102 on which the axial air outlet 106 is located so as to form a circulation channel 108, thereby guiding airflows output from the axial air outlet 106 through an area of the flat wall with which the heat dissipation fin array 104 is aligned, and into the axial air inlet 102a (referring to an arrow in FIG. 1).

In this embodiment, the heat pipe 110 has an end in contact with a lower surface of the heat dissipation fin array 104, and the axial air outlet 106 is aligned with a terminal end 110a of the heat pipe 110 (referring to FIG. 2). The corner of the outer housing 102 where the tongue portion 102c is located is a relatively weak flow section of the radial air outlet 102b. Therefore, even if the axial air outlet 106 "borrows" part of the airflow volume of the radial air outlet 102b, the airflow volume of the radial air outlet 102b is not detracted too much. In addition, the heat exchange between the terminal end 110a of the heat pipe 110 and the heat dissipation fin array 104 is relatively poor (because the temperature difference between the heat pipe and the heat dissipation fin array is relatively small) such that the borrowed airflow volume of the axial air outlet 106 does not affect a thermal performance of the heat pipe 110 too much.

In this embodiment, the circulation channel 108 approximates an L-shaped flow channel, but not being limited to. Moreover, an opening 108d of the circulation channel 108 communicates with the axial air inlet 102a so as to guide airflows from the circulation channel 108 into the axial air inlet 102a.

Figure 3:
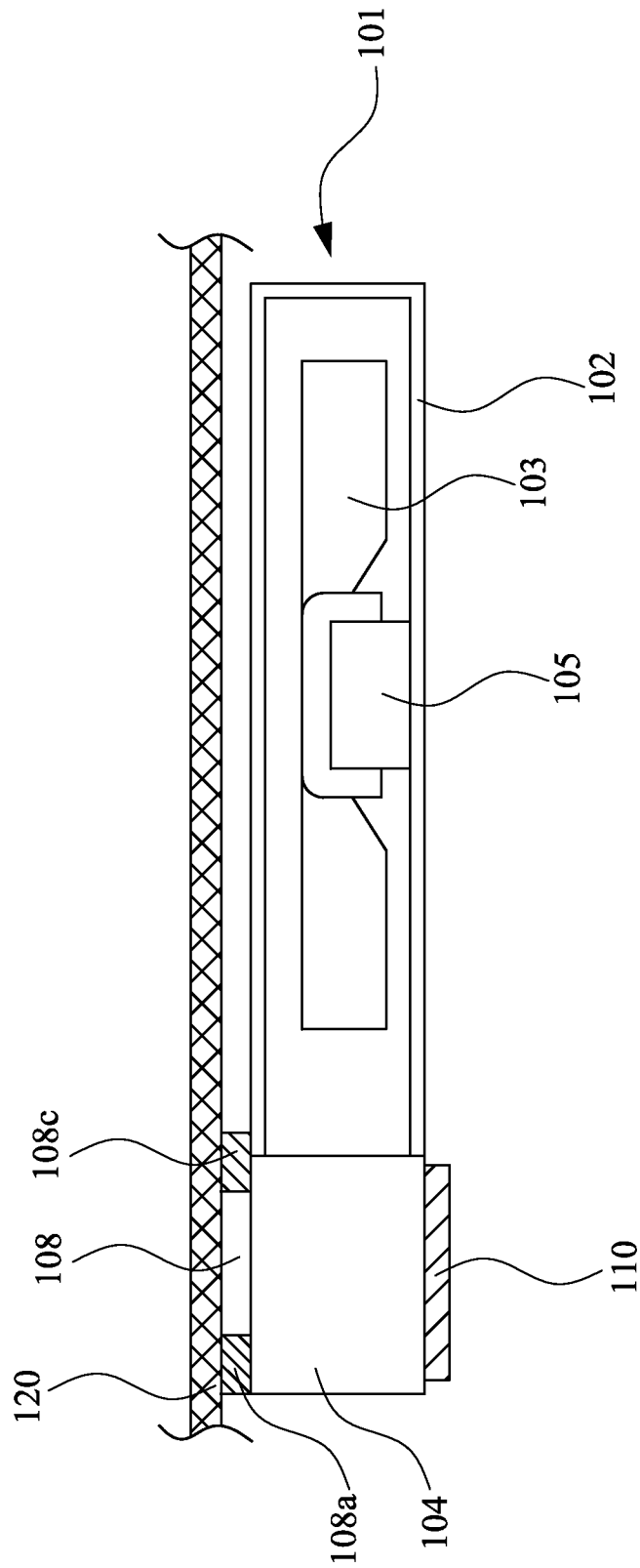
FIG. 3 illustrates a cross-sectional view of a heat dissipation module installed within an electronic device according to an embodiment of this invention.

In this embodiment, retaining walls (108a, 108b, 108c) and the heat pipe 110 are located at two opposite sides of the heat dissipation fin array 104, and part of the retaining walls (108a, 108b, 108c) are aligned with a boundary of the heat dissipation fin array 104 (referring also to FIG. 3). Therefore, an area of the flat wall with which the heat dissipation fin array 104 is aligned can be surrounded by the retaining walls (108a, 108b, 108c) and the circulating airflows can serve as a thermal resistance barrier.

In this embodiment, the retaining walls (108a, 108b, 108c) may be made from, but not being limited to, a sponge.

Referring to FIG. 1, in case the radial air outlet 102b of the outer housing 102 has a length L, a length d2 of the axial air outlet 106 is preferably about 0.1 L, and a width d1 of the axial air outlet 106 is preferably about 0.06 L. Therefore, the borrowed airflow volume of the axial air outlet 106 does not affect a thermal performance of the heat pipe 110 too much. However, the length or width of the axial air outlet should not be limited to the above-described sizes because the heat dissipation module may be equipped with different types of centrifugal fans.

In this embodiment, the heat dissipation fin array 104 can be made from cooper, aluminum or alloys thereof and manufactured by a precision die-casting, CNC machining or metal stamping, etc.

Furthermore, the centrifugal fan 101 may further include a slope 106a located between the tongue potion 102c and the radial air outlet 102b (referring to FIG. 2) to guide airflows to the axial air outlet 106 (referring to FIG. 1). In this embodiment, the slope 106a and the heat dissipation fin array 104 are arranged side by side at the inner wall of the radial air outlet 102b. However, the slope 106a is not a must-have design. Airflows are still output through the axial air outlet 106 without the slope 106a.

Referring both to FIGS. 1 and 3, wherein FIG. 3 illustrates a cross-sectional view of a heat dissipation module installed within an electronic device according to an embodiment of this invention. When the heat dissipation module 100 is installed within an electronic device, the retaining walls (108a, 108b, 108c) are in contact with an inner wall of the electronic device's outer housing 120 so as to form the circulation channel 108. When a rotation-driving device 105 secured within the outer housing 102 drives the impeller 103 to rotate, airflows are output from the axial air outlet 106 and guided through the circulation channel 108 to the axial air inlet 102a. Therefore, even if the heat dissipation fin array 104 cannot effectively take away the heat and its temperature is too high, the circulating airflows within circulation channel 108 can serve as a thermal resistance barrier to prevent the heat on heat dissipation fin array 104 from being transferred to the electronic device's outer housing 120, thereby effectively lowering a temperature of the outer housing 120.

According to an actual experiment, the heat dissipation module with a circulation channel design compared with a conventional heat dissipation module without a circulation channel design, the heat dissipation module with a "circulation channel" design can lower a surface temperature of an outer housing of an electronic device (such as a high-speed computing performance notebook) up to as much as 3° C.

According to the above-discussed embodiments, the heat dissipation module utilizes an axial air outlet of its centrifugal fan to cycle airflows through the circulation channel so as to form a thermal resistance barrier between a heat dissipation fin array and an adjacent the inner wall of the outer housing. In addition, the corner of the centrifugal fan where the axial air outlet is located is a relatively weak flow section of the radial air outlet, the borrowed airflow volume of the axial air outlet does not affect a thermal performance of the heat pipe too much.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module comprising:
   a centrifugal fan comprising:
   an outer housing including an axial air inlet, an axial air outlet and a radial air outlet, wherein the axial air outlet is disposed at a corner of the outer housing where a tongue portion is located;
   a heat dissipation fin array disposed at an inner wall of the radial air outlet;
   a retaining wall disposed on a flat wall of the outer housing on which the axial air outlet is located, the retaining wall being in contact with an inner wall of an electronic device to collectively form a circulation channel so as to guide airflows output from the axial air outlet through an area of the flat wall with which the heat dissipation fin array is aligned, and into the axial air inlet;

an impeller disposed within the outer housing; and a rotation-driving device disposed within the outer housing and used to rotate the impeller; and a heat pipe being in contact with the heat dissipation fin array, wherein the retaining wall and the heat pipe are disposed at two opposite sides of the heat dissipation fin array.

2. The heat dissipation module of claim 1, wherein the axial air outlet is aligned with a terminal end of the heat pipe.

3. The heat dissipation module of claim 1, wherein the circulation channel is an L-shaped channel.

4. The heat dissipation module of claim 3, wherein an opening of the L-shaped channel communicates with the axial air inlet.

5. The heat dissipation module of claim 1, wherein part of the retaining wall is aligned with a boundary of the heat dissipation fin array.

6. The heat dissipation module of claim 1, wherein the heat dissipation fin array is made from cooper, aluminum or alloys thereof.

7. The heat dissipation module of claim 1 further comprising a slope disposed between the tongue potion and the radial air outlet to guide airflows to the axial air outlet.

8. The heat dissipation module of claim 7, wherein the slope and the heat dissipation fin array are disposed side by side at the inner wall of the radial air outlet.

9. The heat dissipation module of claim 1, wherein the retaining wall is made from a sponge.

10. The heat dissipation module of claim 1, wherein the radial air outlet has a length L, the axial air outlet has a length equal to 0.1 L, and the axial air outlet has a width equal to 0.06 L.

* * * * *